United States Patent
Hu (10) Patent No.: US 10,564,669 B2
(45) Date of Patent: Feb. 18, 2020

(54) BUTTON MECHANISM

(71) Applicant: TDK TAIWAN CORP., Taoyuan (TW)

(72) Inventor: Chao-Chang Hu, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 0 days.

(21) Appl. No.: 16/002,301

(22) Filed: Jun. 7, 2018

(65) Prior Publication Data

US 2018/0292861 A1 Oct. 11, 2018

Related U.S. Application Data

(63) Continuation of application No. 15/070,686, filed on Mar. 15, 2016, now Pat. No. 10,019,031.
(Continued)

(30) Foreign Application Priority Data

Jan. 22, 2016 (TW) .............................. 105101979 A (51) Int. Cl.
*G06F 1/16* (2006.01)
*G06F 3/01* (2006.01)
(Continued)

(52) U.S. Cl.
CPC .......... *G06F 1/1626* (2013.01); *G06F 1/1671* (2013.01); *G06F 3/016* (2013.01);
(Continued)

(58) Field of Classification Search
CPC .... G06F 1/1626; G06F 1/1671; G06F 3/0202; G06F 3/016; H03K 17/968; H03K 17/97;
(Continued)

(56) References Cited

U.S. PATENT DOCUMENTS 6,919,522 B2 * 7/2005 Uehira ................... G05G 1/087
200/334
7,667,623 B2 2/2010 Soh et al.
(Continued)

FOREIGN PATENT DOCUMENTS

CN 101661308 A 3/2010
CN 203871204 U 10/2014
(Continued)

OTHER PUBLICATIONS

Taiwanese Office Action dated Jan. 17, 2017 for the corresponding Application No. 105101979; pp. 1-7.

*Primary Examiner* — Edwin A. Leon
*Assistant Examiner* — Lheiren Mae A Caroc
(74) *Attorney, Agent, or Firm* — Muncy, Geissler, Olds & Lowe, P.C.

(57) ABSTRACT

A button mechanism is provided, including a housing, a fixing member fixed on the housing, a moving member movably disposed in the fixing member, a pressing member disposed on the moving member, and a driving module for moving the moving member relative to the fixing member. When the pressing member pushes the moving member to move from an initial position along a first direction to a first position, the driving member moves the moving member from the first position along the first direction to a second position. When the moving member is in the second position, the driving member moves the moving member along a second direction to impact the pressing member, wherein the first direction is opposite to the second direction.

13 Claims, 11 Drawing Sheets

Related U.S. Application Data (60) Provisional application No. 62/222,450, filed on Sep. 23, 2015.

(51) Int. Cl.
    *G06F 3/02*         (2006.01)
    *H03K 17/968*    (2006.01)
    *H03K 17/97*     (2006.01)
    *H01H 3/00*      (2006.01)

(52) U.S. Cl.
    CPC .......... *G06F 3/0202* (2013.01); *H03K 17/968* (2013.01); *H03K 17/97* (2013.01); *H01H 2003/008* (2013.01); *H01H 2215/05* (2013.01); *H01H 2231/022* (2013.01)

(58) Field of Classification Search
    CPC ......... H01H 2231/022; H01H 2215/05; H01H 2003/008
    USPC .............................. 200/341, 520; 310/323.02
    See application file for complete search history.

(56) References Cited

U.S. PATENT DOCUMENTS

| | | |
|---|---|---|
| 8,008,591 B2 | 8/2011 | Shi et al. |
| 2009/0201110 A1* | 8/2009 | Yamada ............... H01H 36/008 335/205 |
| 2010/0236911 A1 | 9/2010 | Wild et al. |
| 2012/0218651 A1 | 8/2012 | Onishi et al. |

FOREIGN PATENT DOCUMENTS

| | | |
|---|---|---|
| TW | 201517094 A | 5/2015 |
| TW | 201523673 A | 6/2015 |
| TW | I486985 B | 6/2015 |

\* cited by examiner

BUTTON MECHANISM

CROSS REFERENCE TO RELATED APPLICATIONS

This application is a Continuation of application Ser. No. 15/070,686, filed on Mar. 15, 2016, which claims the benefit of U.S. Provisional Application No. 62/222,450, filed Sep. 23, 2015, and Taiwan Patent Application No. 105101979, filed Jan. 22, 2016.

BACKGROUND OF THE INVENTION

Field of the Invention

The application relates in general to a button mechanism, and in particular, to a button mechanism which can generate force feedback.

Description of the Related Art

In recent years, as technology has advanced, electronic devices such as mobile phones, tablet computers, notebook computers, and smartphones have become more commonplace, and have been developed to be more convenient, multi-functional and exquisite. More and more choices are provided for users to choose from.

An electronic device usually includes buttons on a housing for controlling, for example, power or volume. However, when the user presses the button, he often cannot tell whether or not the button has been pressed deeply enough to activate its function.

BRIEF SUMMARY OF INVENTION

To address the deficiencies of conventional products, an embodiment of the invention provides a button mechanism including a housing, a fixing member fixed on the housing, a moving member movably disposed in the fixing member, a pressing member disposed on the moving member, and a driving module for moving the moving member relative to the fixing member. When the pressing member pushes the moving member to move from an initial position along a first direction to a first position, the driving member moves the moving member from the first position along the first direction to a second position. When the moving member is in the second position, the driving member moves the moving member along a second direction to impact the pressing member, wherein the first direction is opposite to the second direction.

In some embodiments, a first distance is formed between the initial position and the first position, and a second distance is formed between the first position and the second position, wherein the first distance and the second distance are proportional.

In some embodiments, the driving module comprises a motor.

In some embodiments, the motor is an electromagnetic motor, comprising a coil and a magnetic member.

In some embodiments, the coil is disposed on the moving member, and the magnetic member is disposed on the fixing member.

In some embodiments, the coil is disposed on the fixing member, and the magnetic member is disposed on the moving member.

In some embodiments, the motor is a piezoelectric motor, comprising a piezoelectric member and a pillar, wherein the pillar connects the piezoelectric member, and the moving member is movably connected to the pillar.

In some embodiments, the driving module comprises a first elastic member, connecting the fixing member with the moving member.

In some embodiments, the driving module comprises a position detector for detecting the position of the moving member, electrically connected to the driving module.

In some embodiments, the position detector comprises a hall sensor, a magnetoresistance effect sensor, a giant magnetoresistance effect sensor, a tunneling magnetoresistance effect sensor, an optical encoder, or an infrared sensor.

In some embodiments, when the moving member is in the initial position, the moving member contacts the pressing member.

In some embodiments, when the moving member is in the initial position, the driving module provides a preload along the second direction on the moving member.

In some embodiments, the button mechanism further comprises an elastomer, connecting the housing with the pressing member.

In some embodiments, the pressing member is connected to the housing and comprises a flexible material.

In some embodiments, the pressing member and the housing are integrally formed in one piece.

In some embodiments, when the moving member is in the initial position, the pressing member is aligned with the surface of the housing.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The making and using of the embodiments of the button mechanism are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood by one of ordinary skill in the art to which this invention belongs. It should be appreciated that each term, which is defined in a commonly used dictionary, should be interpreted as having a meaning conforming to the relative skills and the background or the context of the present disclosure, and should not be interpreted by an idealized or overly formal manner unless defined otherwise.

Figure 1:
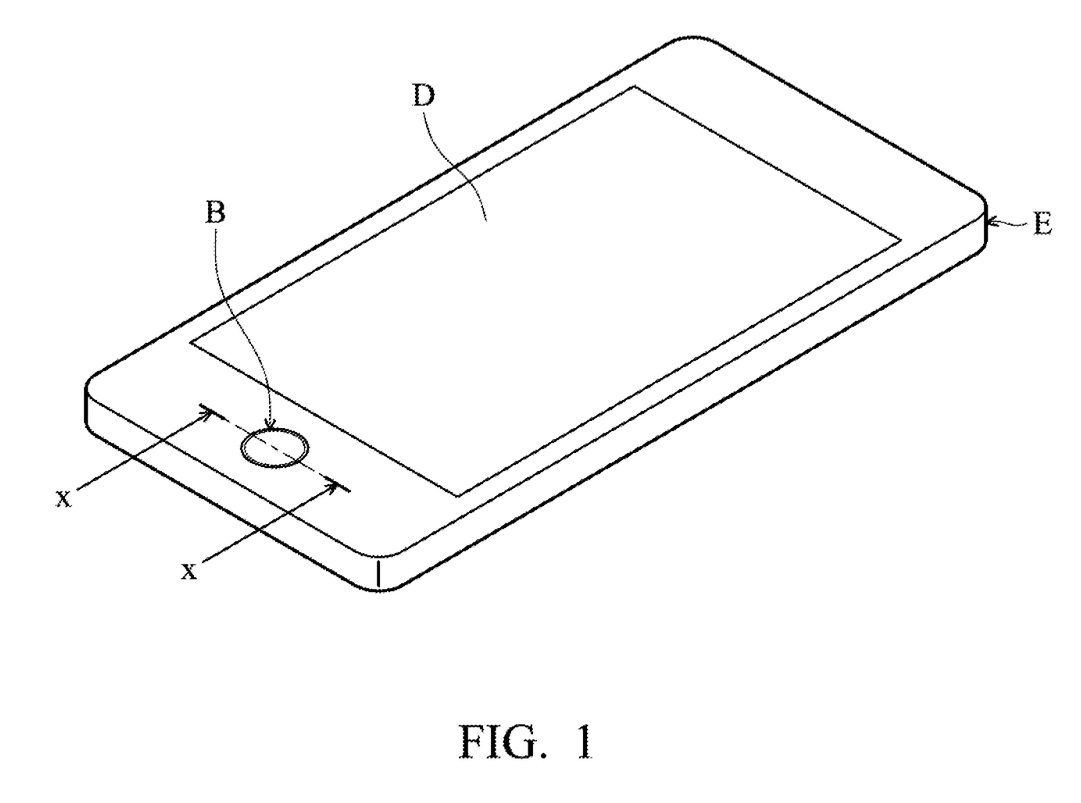
FIG. 1 is a schematic diagram of a button mechanism in an electronic device according to an embodiment of the invention.

First, referring to FIG. 1, an electronic device E comprises a button mechanism B, wherein the button mechanism B is electrically connected to a display panel D of the electronic device E. When the user presses the button mechanism B, a signal is transmitted to the display panel D, and the display panel D shows a corresponding image. The electronic device E is a smartphone or a tablet computer, for example.

Figure 2:
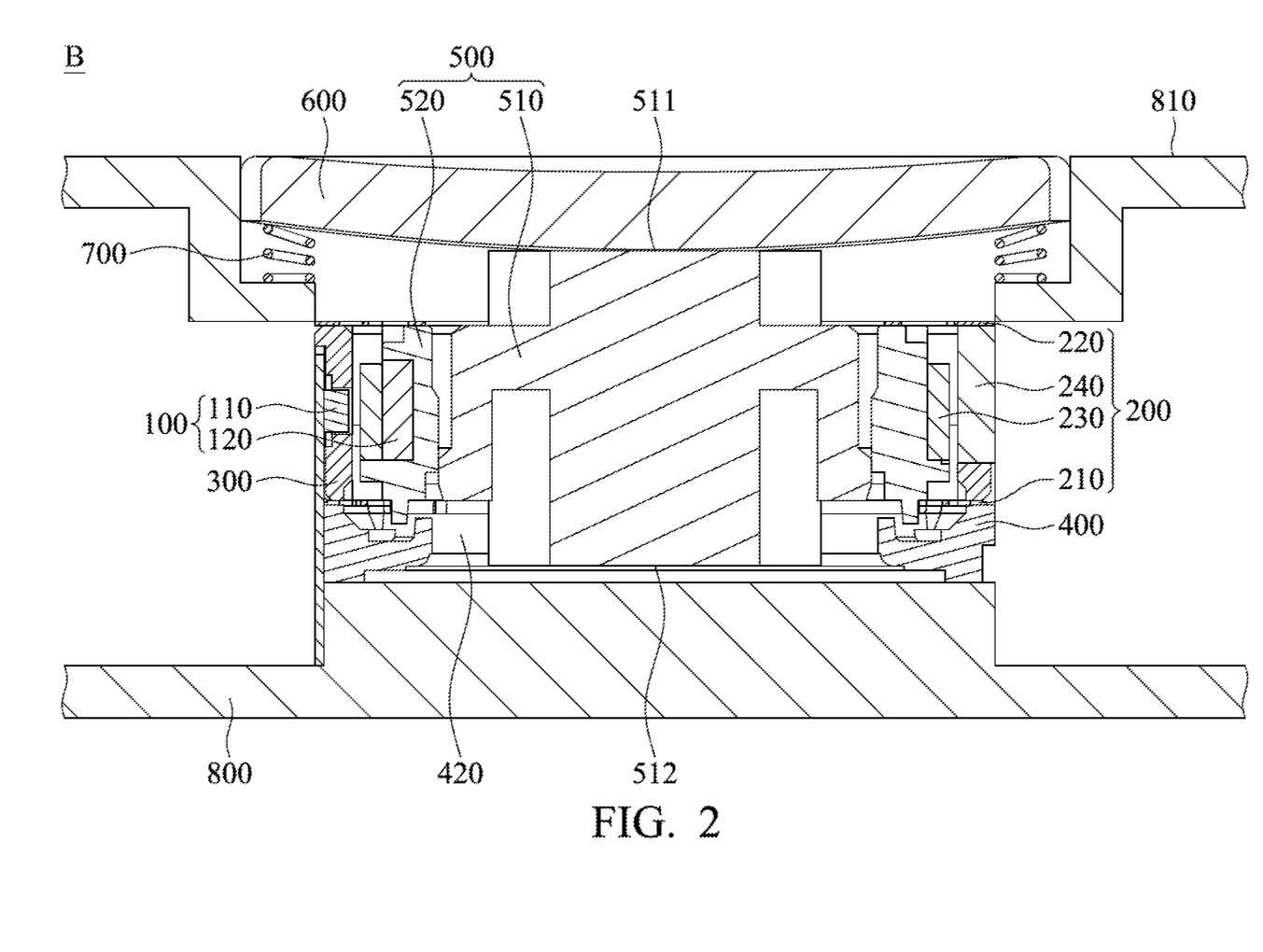
FIG. 2 is a cross-sectional view along the line x-x in FIG. 1.
Figure 3A:
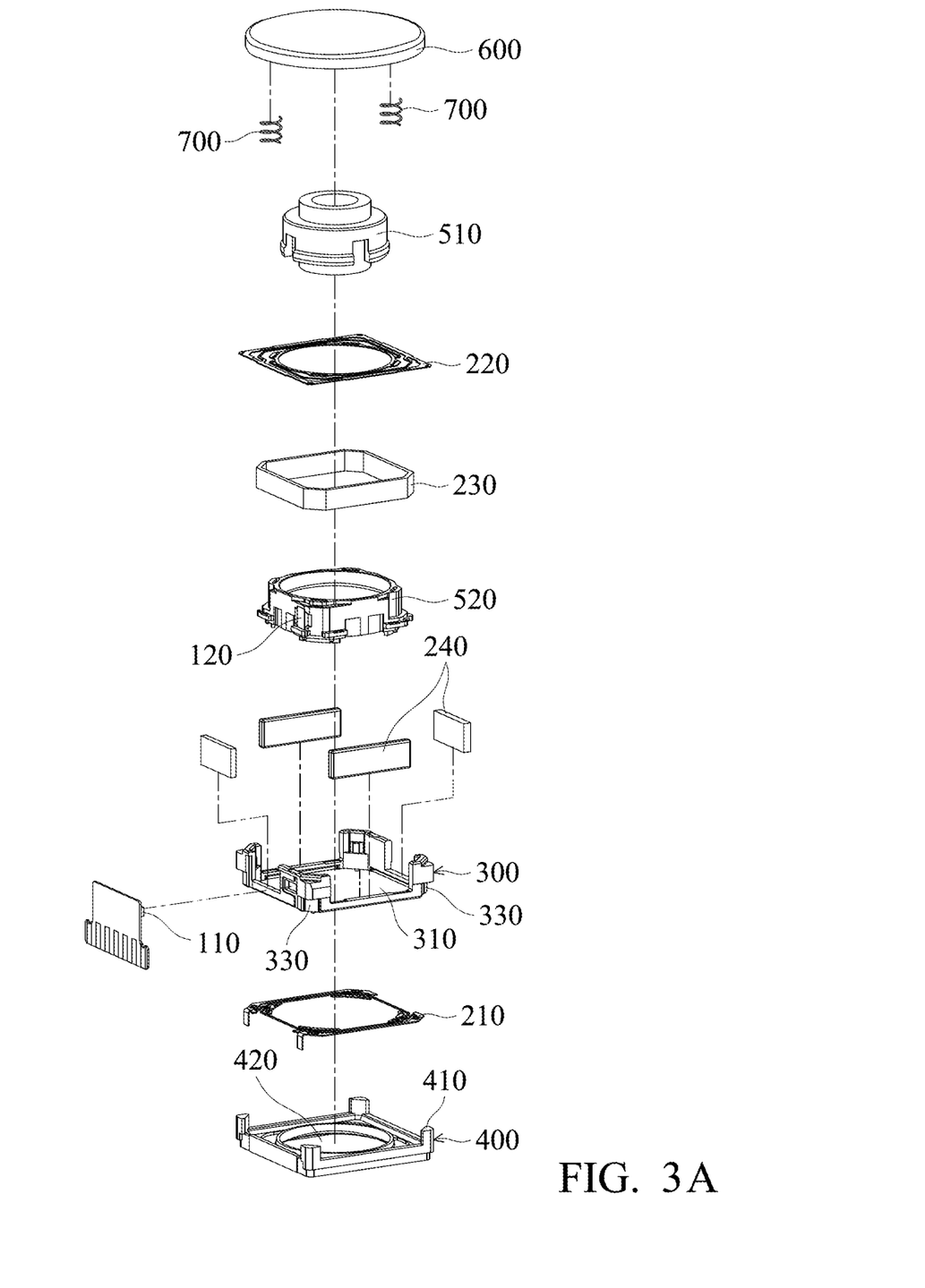
FIG. 3A is an exploded-view diagram of a button mechanism without a housing according to an embodiment of the invention.

As shown in FIGS. 2 and 3A, the button mechanism B primarily comprises a position detector 100, a driving module 200, a fixing member 300, a stopping member 400, a moving member 500, a pressing member 600, at least one elastomer 700, and a housing 800. The position detector 100 comprises a sensor 110 and a sensing object 120, and the driving module 200 comprises a first elastic member 210, a second elastic member 220, and a motor. In this embodiment, the aforementioned motor is an electromagnetic motor, comprising a coil 230 and at least one magnetic member 240.

The sensor 110 can be a hall sensor, a magnetoresistance effect sensor (MR sensor), a giant magnetoresistance effect sensor (GMR sensor), a tunneling magnetoresistance effect sensor (TMR sensor), an optical encoder, or an infrared sensor. When the hall sensor, the magnetoresistance effect sensor, the giant magnetoresistance effect sensor, or the tunneling magnetoresistance effect sensor is used as the sensor 110, the sensing object 120 can be a magnet. When the optical encoder or the infrared sensor is used as the sensor 110, the sensing object 120 can be a reflective sheet.

Figure 3B:
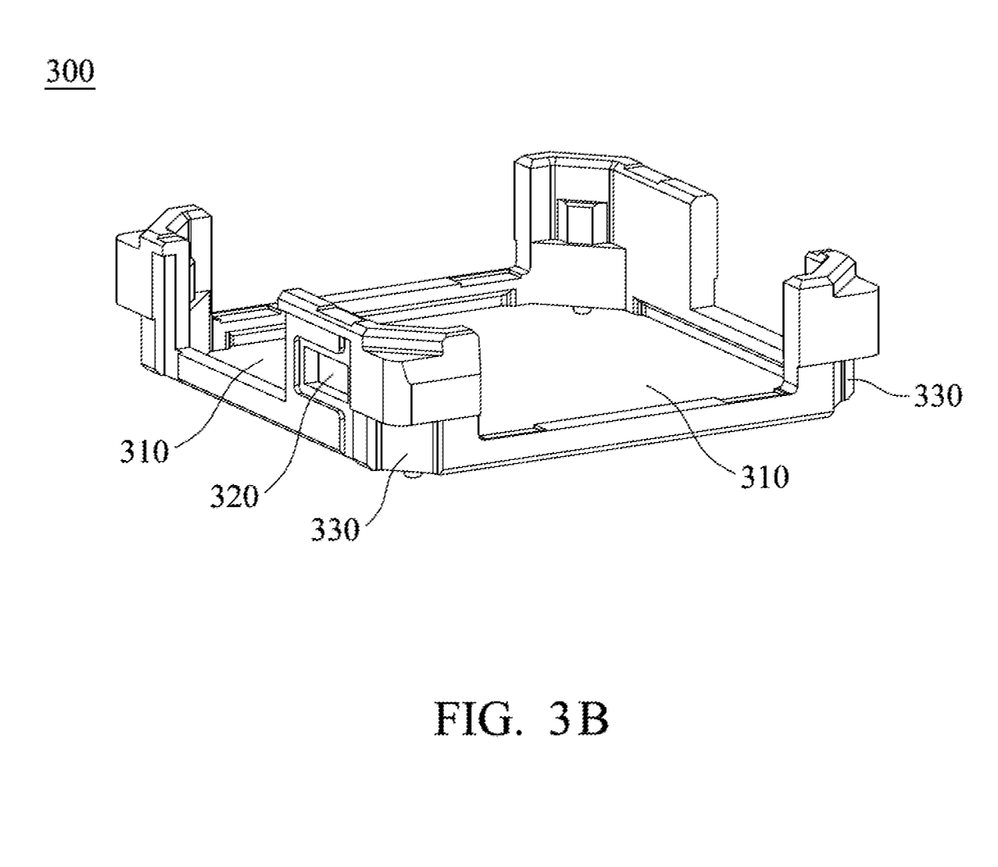
FIG. 3B is a schematic diagram of a fixing member according to an embodiment of the invention.

Referring to FIGS. 2, 3A, and 3B, the fixing member 300 has a hollow rectangular structure, and a plurality of recesses 310 and a hole 320 are formed on the side wall thereof. The magnetic members 240 of the driving module 200 are disposed in the recesses 310, and the sensor 110 of the position detector 100 passes through the hole 320. The fixing member 300 further comprises a plurality of engaged depressions 330, and the stopping member 400 comprises a plurality of engaged protrusions 410, wherein the appearance and the position of the engaged protrusion 410 corresponds to that of the engaged depression 330. Thus, the fixing member 300 can be joined to the stopping member 400 by engaging the engaged protrusions with the engaged depressions 300. The first elastic member 210 can be clamped between the fixing member 300 and the stopping member 400. The stopping member 400 is fixed on the housing 800, so that when the fixing member 300 is engaged with the stopping member 400, the fixing member 300 is fixed on the housing 800 too.

Moreover, an opening 420 is formed on the center of the stopping member 400, the moving member 500 can pass through the opening 420.

The moving member 500 comprises a main body 510 and a carrier 520. The main body 510 is fixed on the carrier 520, and the carrier 520 surrounds the main body 510. The main body 510 is used to impact the pressing member 600, and the user can feel the force feedback. Therefore, the main body 510 can have large dimensions and weight. For example, as shown in FIG. 2, the height of the main body 510 exceeds that of the carrier 520, and exceeds the height of the fixing member 300 plus the height of the stopping member 400. The top end 511 of the main body 510 protrudes from the top surface of the fixing member 300 for easily impacting the pressing member 600. The bottom end 512 of the main body 510 passes through the opening 420 of the stopping member 400 for increasing the weight of the moving member 500.

The coil 230 of the driving module 200 is disposed on the carrier 520 of the moving member 500 and around the carrier 520. The sensing object 120 of the position detector 100 is also disposed on the carrier 520, and corresponds to the sensor 110. Thus, when the moving member moves, the coil 230 and the sensing object 120 move accordingly.

As shown in FIG. 2, the first elastic member 210 and the second elastic member 220 are respectively disposed on the opposite sides of the moving member 500 (or the opposite sides of the fixing member 300), and both the first elastic member 210 and the second elastic member 220 connect the fixing member 300 with the moving member 500. Therefore, in this embodiment, the moving member 500 can be hung in the hollow structure of the fixing member 300 by the first and second elastic members 210, 220.

It should be noted that, in this embodiment, the magnetic members 240 are disposed on four sides of the fixing member 300, and the motor of the driving module 200 can provide a large force to move the moving member 500 relative to the fixing member. However, the number and the dimensions of the magnetic members 240 can be adjusted as required. In some embodiments, the coil 230 is disposed on the fixing member 300, and the magnetic members 240 are disposed on the carrier 520 of the moving member 500. When the moving member 500 moves, the magnetic members 240 move accordingly. In some embodiments, the magnetic member 240 disposed on the moving member 500 can be used as the sensing object 120 of the position detector 100. The elements in the button mechanism can be reduced.

In some embodiments, the first elastic member 210 or the second elastic member 220 can be omitted, or both of them can be omitted. The moving member 500 can be hung in the hollow structure of the fixing member 300 by the electromagnetic motor. Furthermore, in some embodiments, the fixing member 300 and the stopping member 400 can be integrally formed in one piece, and the main body 510 and the carrier 520 of the moving member 500 can also be integrally formed in one piece.

Referring to FIGS. 2 and 3A, the pressing member 600 connects the moving member 500, and connects the housing 800 through the elastomer 700. It should be noted that, in this embodiment, when the pressing member 600 is not pressed by the user, the moving member 500 is in an initial position, and the driving module 200 provides an upward preload (along a second direction A2 shown in FIG. 4C) on the moving member 500, such that there is no gap between the moving member 500 and the pressing member 600. Furthermore, as shown in FIG. 2, when the moving member 500 is in the initial position, the pressing member 600 is aligned with a surface 810 of the housing 800. An integrated appearance can be achieved.

In some embodiments, the pressing member 600 can be fixed directly on the housing 800 and have a flexible material. When the user presses the pressing member 600, the pressing member is deformed. The elastomer 700 can be omitted. In some embodiments, the pressing member 600 and the housing 800 can be integrally formed in one piece.

Figure 4A:
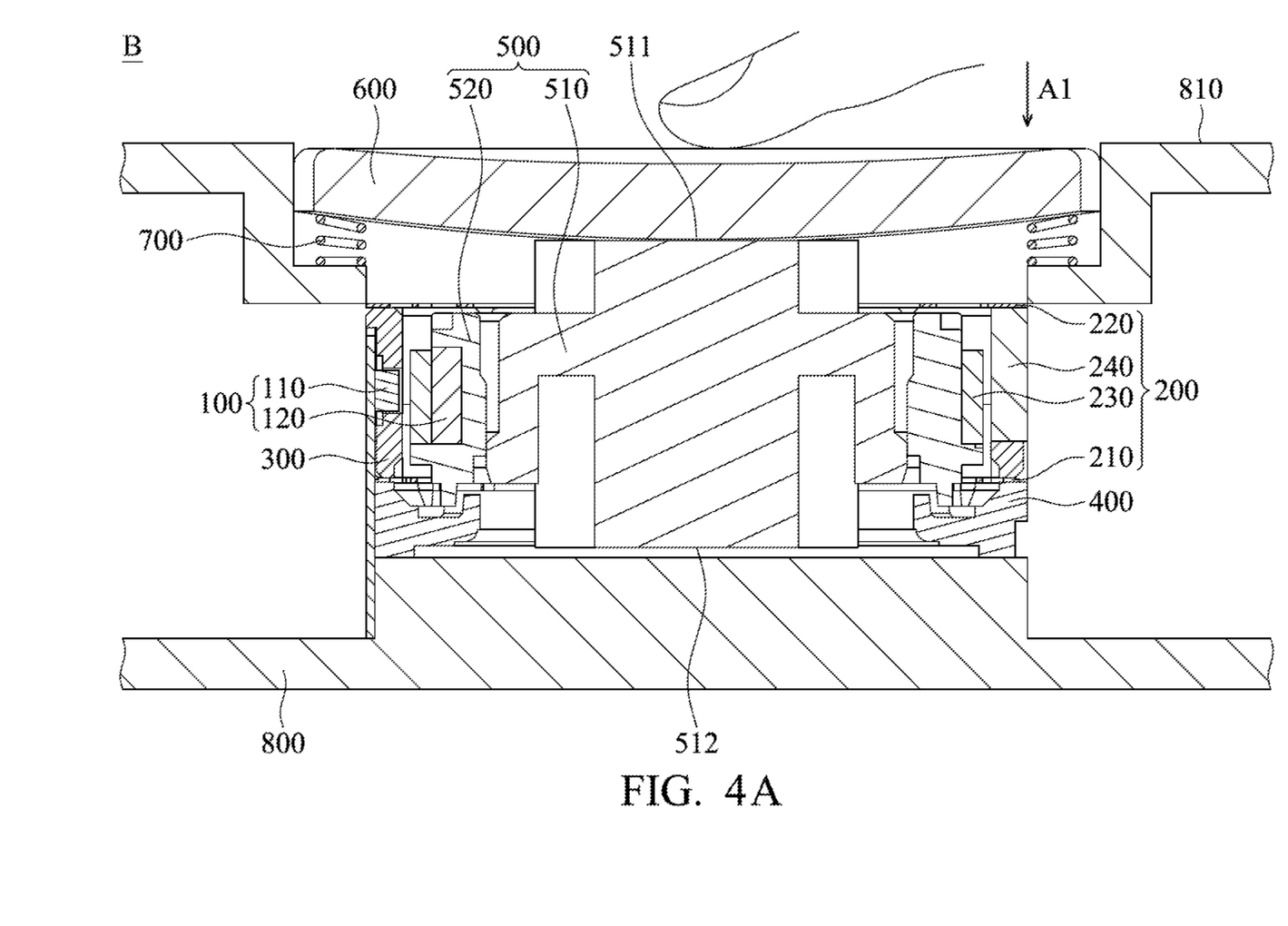
FIG. 4A is a schematic diagram representing a user pressing a pressing member along a first direction according to an embodiment of the invention.
Figure 4B:
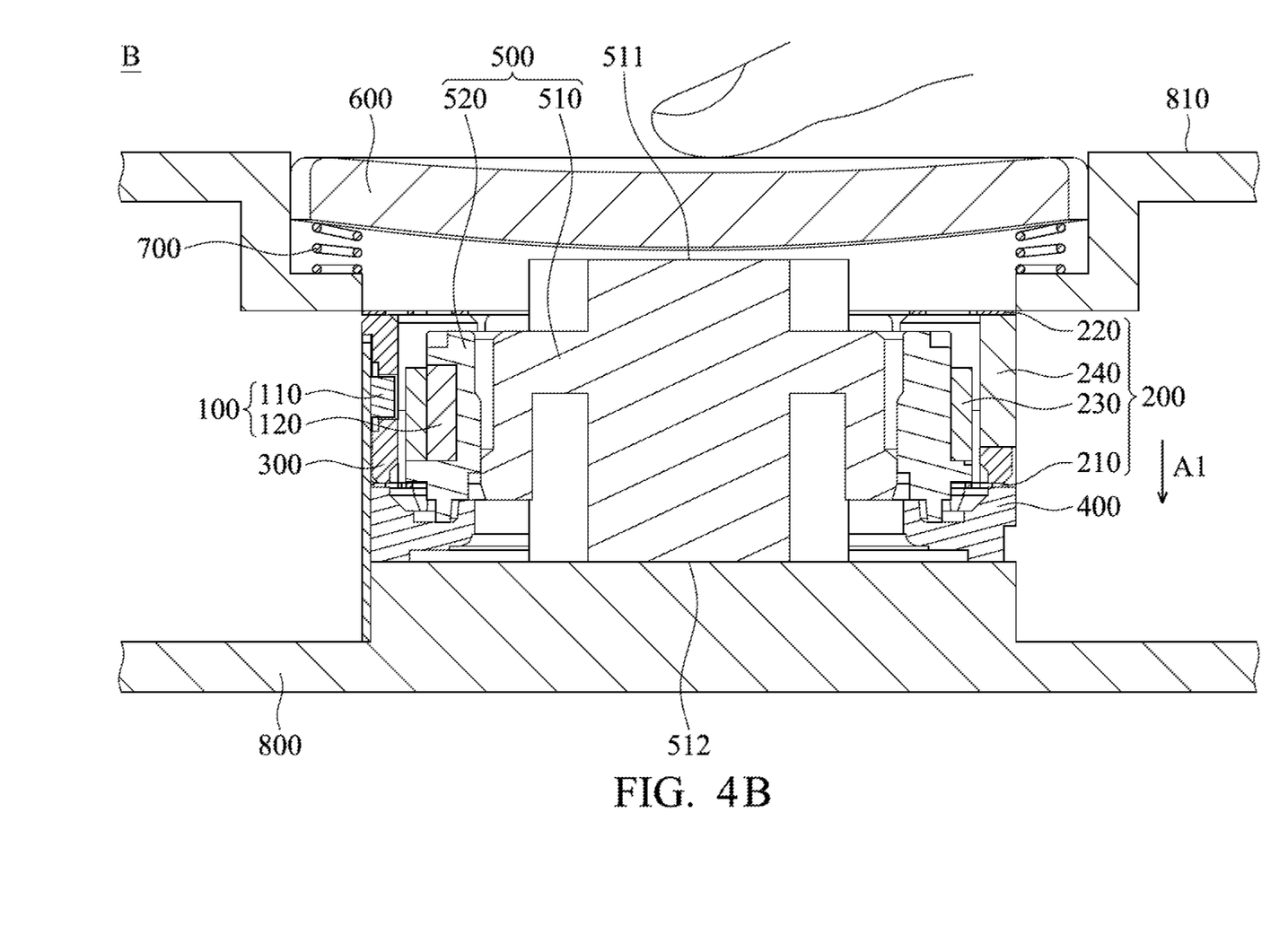
FIG. 4B is a schematic diagram representing a moving member moving along the first direction and separating from the pressing member according to an embodiment of the invention.
Figure 4C:
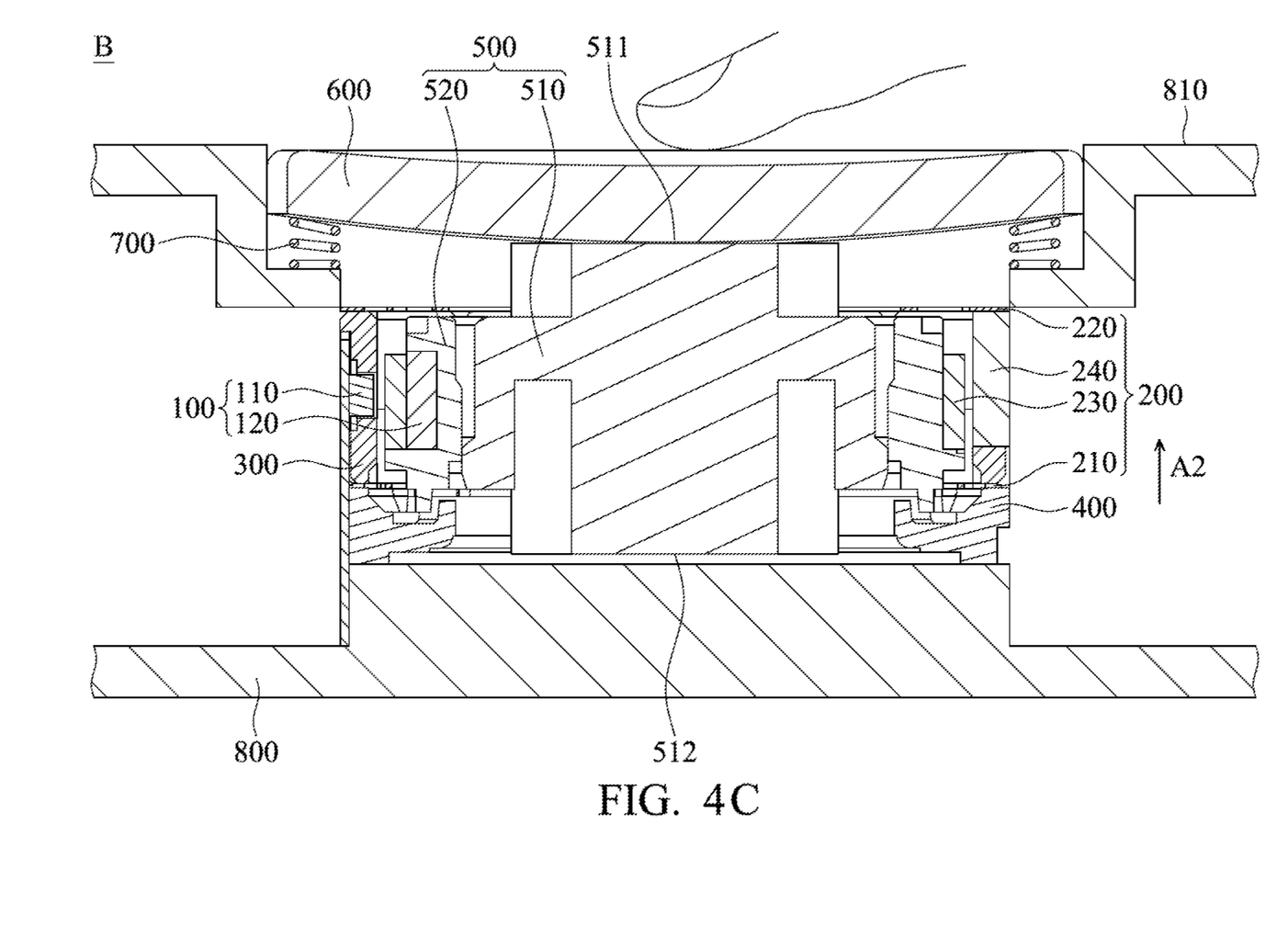
FIG. 4C is a schematic diagram representing the moving member moving along the second direction and impacting the pressing member according to an embodiment of the invention.

Referring to FIG. 4A, when the user presses the pressing member 600, the pressing member 600 pushes the moving member 500 to move from the initial position along a first direction A1 to a first position. Subsequently, as shown in FIG. 4B, when the position detector 100 detects that the moving member 500 stops in the first position, the position detector 100 transmits a signal to the driving module 200, and the motor of the driving module 200 drives the moving member 500 to move from the first position along the first direction A1 to a second position and separate from the pressing member 600. Finally, as shown in FIG. 4C, the first elastic member 210, the second elastic member 220, and the motor of the driving module 200 moves the moving member 500 along the second direction A2 to impact the pressing member 600, wherein the second direction A2 is opposite to the first direction A1. When the user feels the impact from the moving member 500, he may realize that the pressing operation is finished.

When the pressing member 600 is not pushed by the user, the elastomer 700 provides a restoring force to push the pressing member 600 moving along the second direction A2 and back to the position shown in FIG. 2. Moreover, since the driving module 200 provides the preload along the second direction A2 on the moving member 500, the moving member 500 can also be moved back to the initial position.

It should be noted that a first distance is formed between the initial position and the first position, and a second distance is formed between the first position and the second position. In this embodiment, the first distance and the second distance are proportional. Therefore, the impacting force from the moving member 500 is different due to the different pressing depth (large second distance can generate a large impacting force). The user may realize how deep the pressing member 600 has been pushed thereby.

Figure 5:
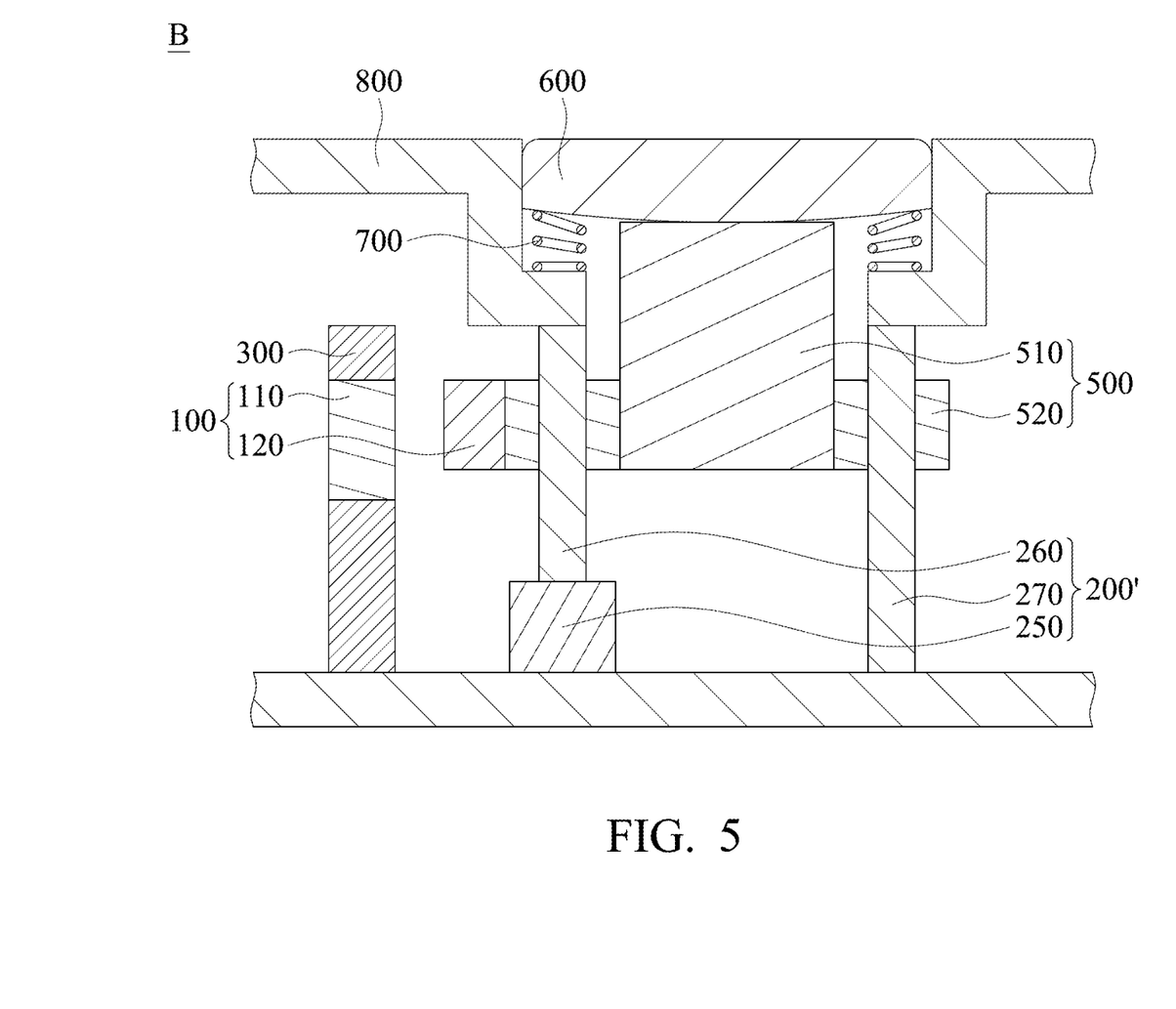
FIG. 5 is a schematic diagram of a button mechanism in an electronic device according to another embodiment of the invention.

Referring to FIG. 5, in another embodiment, the motor of the driving module 200' is a piezoelectric motor, comprising a piezoelectric member 250, a pillar 260, and a guiding rod 270. The moving member 500 is movably disposed on the pillar 260 and the guiding rod 270, and the pillar connects to the piezoelectric member 250.

Figure 6A:
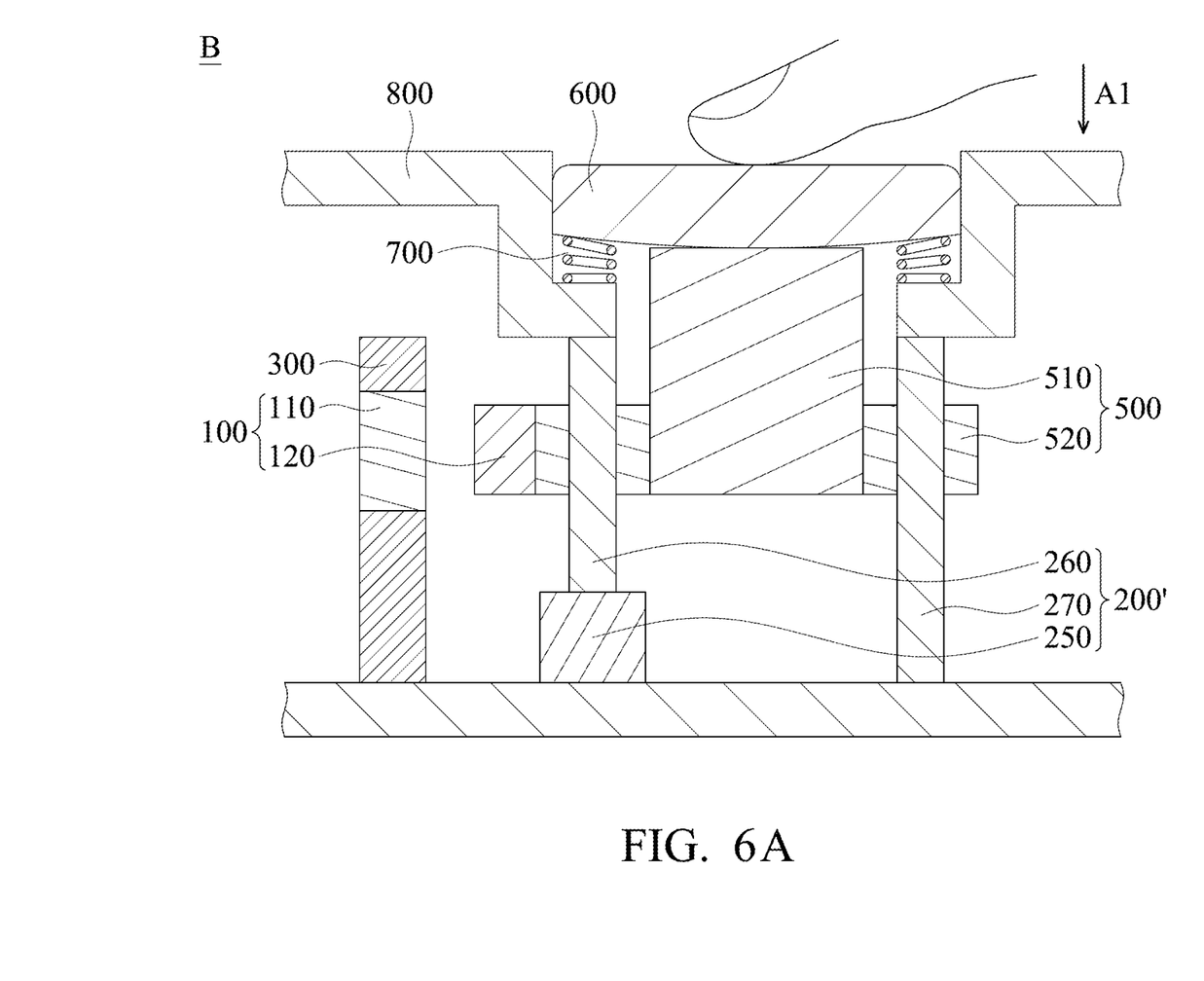
FIG. 6A is a schematic diagram representing a user pressing a pressing member along a first direction according to another embodiment of the invention.
Figure 6B:
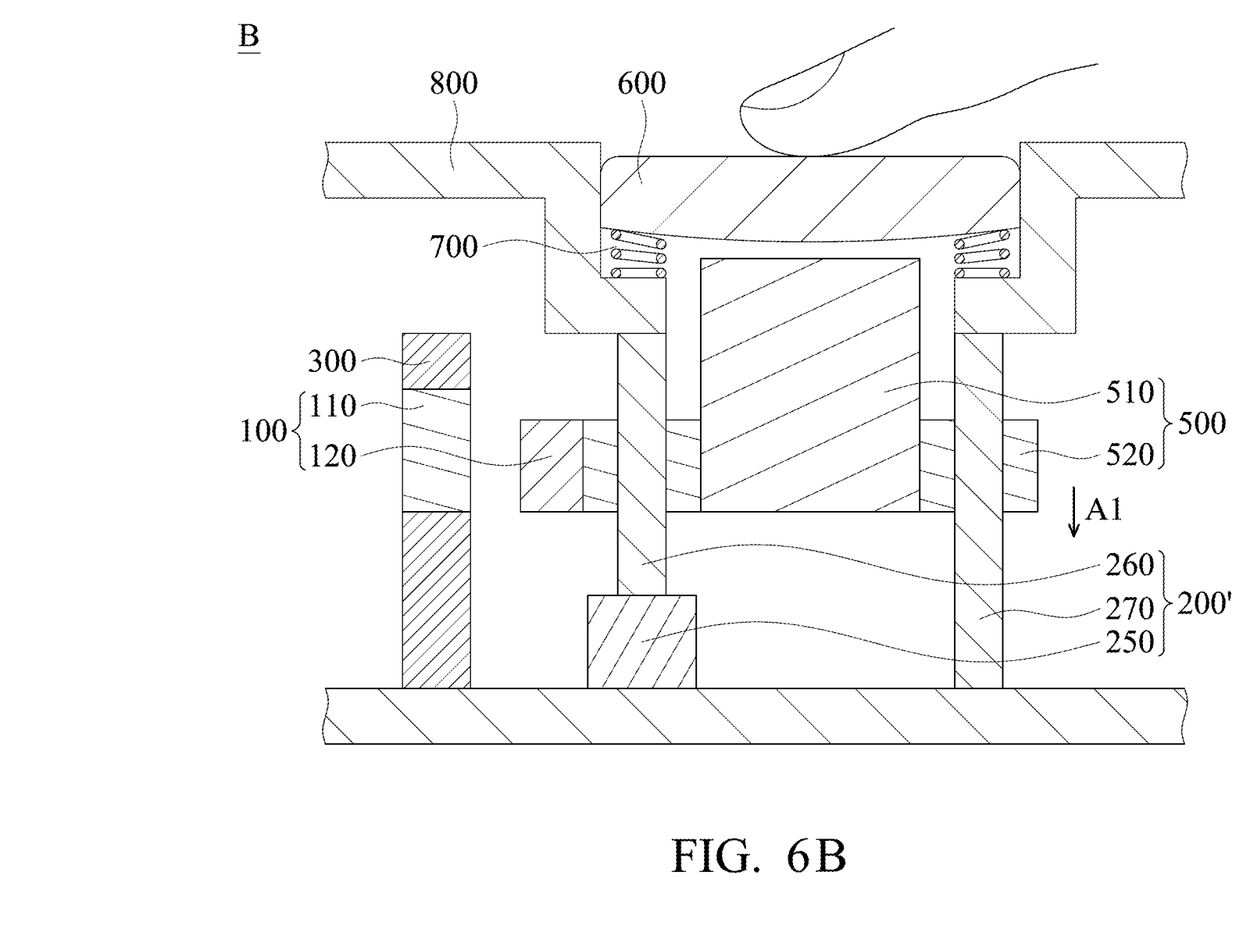
FIG. 6B is a schematic diagram representing a moving member moving along the first direction and separating from the pressing member according to an embodiment of the invention.
Figure 6C:
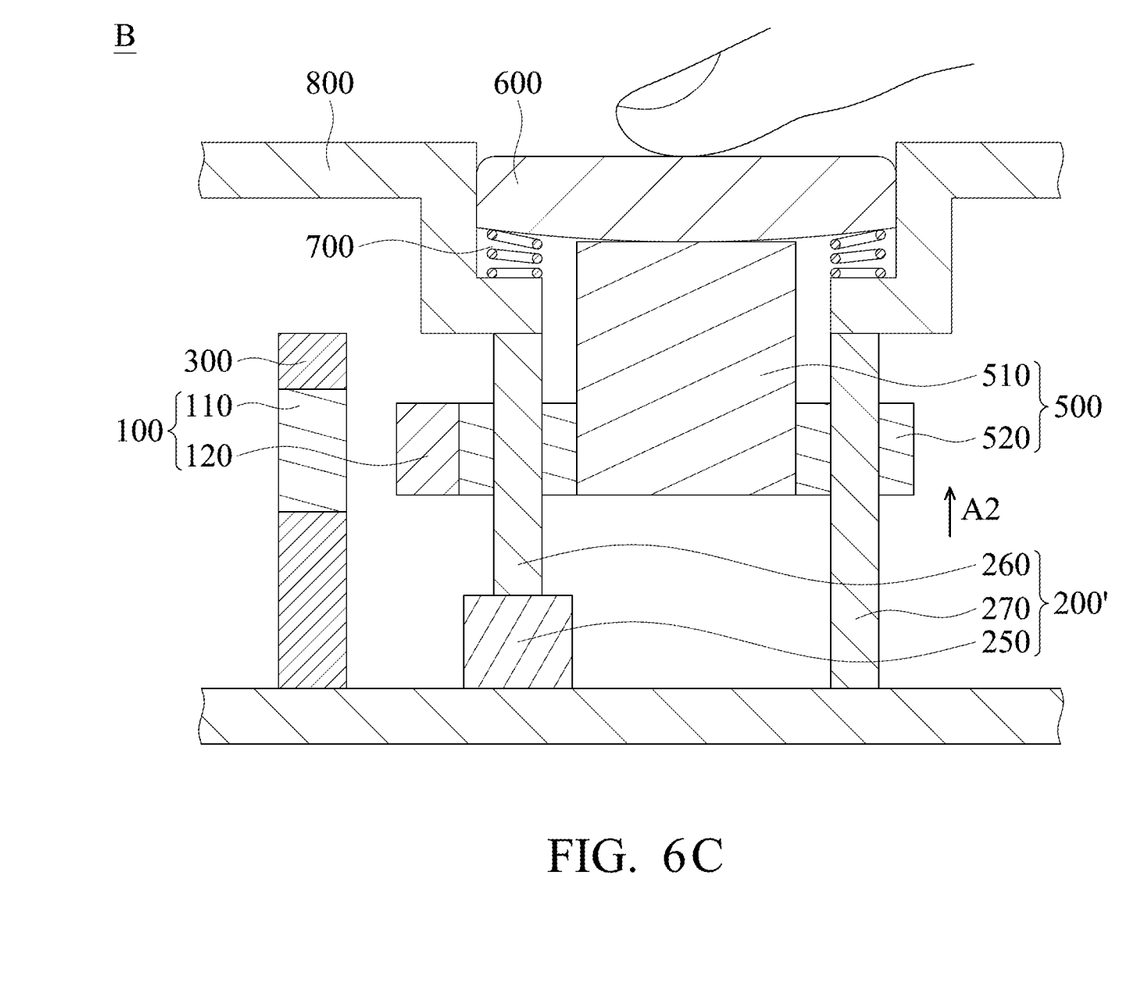
FIG. 6C is a schematic diagram representing the moving member moving along the second direction and impacting the pressing member according to another embodiment of the invention.

As shown in FIG. 6A, when the user presses the pressing member 600, the pressing member 600 pushes the moving member 500 to move from the initial position along the first direction A1 to the first position. Subsequently, as shown in FIG. 6B, when the position detector 100 detects that the moving member 500 stops in the first position, the position detector 100 transmits a signal to the driving module 200'. The piezoelectric motor of the driving module 200' moves the moving member 500 from the first position along the first direction A1 to the second position. Finally, as shown in FIG. 6C, the piezoelectric motor of the driving module 200' moves the moving member 500 along the second direction A2 to impact the pressing member 600. When the user feels the impact from the moving member 500, he may realize that the pressing operation is finished.

In summary, a button mechanism is provided. When the user presses the pressing member and pushes the moving member to move, the position detector can detect the position thereof and transmit the signal to the driving module. The driving module can move the moving module to impact the pressing member. The user may realize that the pressing operation is finished.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A button mechanism, comprising:
    a button assembly, sensing a pushing force outside the button mechanism;
    a feedback assembly, generating a vibration on the button assembly, comprising:
    a moving member;
    a fixing member, elastically connected to the moving member; and
    a driving module, wherein the driving module can drive the moving member to move along a main axis relative to the button assembly toward a first direction and a second direction opposite to the first direction when a current flows through the driving module, and the first direction is parallel to the second direction, wherein the button assembly has a surface for pressing, and the surface, the button assembly and the driving module are sequentially arranged along the main axis.

2. The button mechanism as claimed in claim 1, wherein the feedback assembly further comprises a position detector for sensing the movement of the moving member relative to the fixing member.

3. The button mechanism as claimed in claim 2, wherein the position detector comprises a magnetic sensor affixed to the fixing member and a sensing object affixed to the moving member.

4. The button mechanism as claimed in claim 1, wherein the feedback assembly further comprises a first elastic member, disposed on a side of the moving member, and elastically connected to the moving member and the fixing member.

5. The button mechanism as claimed in claim 4, wherein the feedback assembly further comprises a second elastic member, disposed on an opposite side of the moving member, and elastically connected to the moving member and the fixing member.

6. The button mechanism as claimed in claim 5, wherein the driving module is disposed between the moving member and the fixing member, and comprises a coil and a magnetic member, wherein the driving module and the first and second elastic members are disposed on the different sides of the moving member.

7. The button mechanism as claimed in claim 1, wherein the moving member can move relative to the button assembly.

8. A button mechanism, comprising:
 a button assembly, sensing a pushing force outside the button mechanism;
 a feedback assembly, generating a vibration on the button assembly, comprising:
 a moving member;
 a fixing member, elastically connected to the moving member;
 a driving module, wherein the driving module can drive the moving member to move along a main axis relative to the button assembly toward a first direction and a second direction opposite to the first direction when a current flows through the driving module, and the first direction is parallel to the second direction; and
 a first elastic member, disposed on a side of the moving member, and elastically connected to the moving member and the fixing member.

9. The button mechanism as claimed in claim 8, wherein the feedback assembly further comprises a second elastic member, disposed on an opposite side of the moving member, and elastically connected to the moving member and the fixing member.

10. The button mechanism as claimed in claim 9, wherein the driving module is disposed between the moving member and the fixing member, and comprises a coil and a magnetic member, wherein the driving module and the first and second elastic members are disposed on the different sides of the moving member.

11. The button mechanism as claimed in claim 8, wherein the feedback assembly further comprises a position detector for sensing the movement of the moving member relative to the fixing member.

12. The button mechanism as claimed in claim 11, wherein the position detector comprises a magnetic sensor affixed to the fixing member and a sensing object affixed to the moving member.

13. The button mechanism as claimed in claim 8, wherein the moving member can move relative to the button assembly.

* * * * *